(12) United States Patent
Ahn et al.

(10) Patent No.: US 6,812,109 B2
(45) Date of Patent: Nov. 2, 2004

(54) INTEGRATED DECOUPLING CAPACITORS

(75) Inventors: Kie Y. Ahn, Chappaqua, NY (US); Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/372,813

(22) Filed: Feb. 26, 2003

(65) Prior Publication Data
US 2004/0016944 A1 Jan. 29, 2004

Related U.S. Application Data

(62) Division of application No. 09/852,668, filed on May 11, 2001, now Pat. No. 6,552,383.

(51) Int. Cl.⁷ .............................................. H01L 21/20
(52) U.S. Cl. .................... 438/386; 438/387; 257/308; 257/532
(58) Field of Search .............................. 438/386, 387, 438/242; 257/308, 532, 302

(56) References Cited

U.S. PATENT DOCUMENTS

| | | | |
|---|---|---|---|
| 4,427,457 A | | 1/1984 | Carlson et al. |
| 4,984,039 A | * | 1/1991 | Douglas ............... 257/301 |
| 5,077,688 A | | 12/1991 | Kumanoya et al. |
| 5,650,351 A | | 7/1997 | Wu |
| 5,661,063 A | | 8/1997 | Lee |
| 5,733,808 A | | 3/1998 | Tseng |
| 5,770,875 A | * | 6/1998 | Assaderaghi et al. ....... 257/301 |
| 6,027,980 A | | 2/2000 | Gardner |
| 6,034,391 A | | 3/2000 | Tobita |
| 6,097,053 A | | 8/2000 | Ando |
| 6,114,201 A | | 9/2000 | Wu |
| 6,124,625 A | | 9/2000 | Chern et al. |
| 6,191,479 B1 | | 2/2001 | Herrell et al. |
| 6,201,273 B1 | | 3/2001 | Wang et al. |
| 6,236,103 B1 | | 5/2001 | Bernstein et al. |

OTHER PUBLICATIONS

K. Lee, "On–Chip Interconnects–Gigahertz and Beyond," Proc. Int. Interconnect Technology Conf., p. 15–17, 1998. See also Solid–State Technology, pp. 85–89, Sep. 1998.

Jo Lernout et al., "A Five–Layer Thin Film MCM–Si Design Using Oxynitride Dielectrics," Microelectronics International, vol. 13, No. 1, p. 39–42, 1998.

Primjeet Chahal et al., "A Novel Integrated Decoupling Capacitor for MCM–L Technology", IEEE Transactions on Components, Packaging, and Manufacturing Technology, Part B, vol. 21, No. 2, p. 184–193, 1998.

Tam Pandhumsoporn et al., "High Etch Rate, Deep Anisotropic Etching of Silicon for MEMS Fabrication," Proceedings of SPIE, vol. 3328, p. 93–101, 1998.

H. W. Lau et al., "High Aspect Ratio Silicon Pillars Fabricated by Electrochemical Etching and Oxidation of Microporous Silicon," Thin Solid Films, vol. 276, No. 276, p. 29–31, 1996.

(List continued on next page.)

Primary Examiner—David Nelms
Assistant Examiner—Tu-Tu Ho
(74) Attorney, Agent, or Firm—Dickstein Shapiro Morin & Oshinsky LLP

(57) ABSTRACT

A method for fabricating buried decoupling capacitors in an integrated circuit is disclosed. The method forms decoupling capacitors by creating an opening within a substrate which has fin-like spacers, depositing a dielectric material over the spacers, depositing an electrode material over the dielectric material, depositing an insulative material over the electrode material, and forming integrated circuit components over the insulative material.

108 Claims, 11 Drawing Sheets

OTHER PUBLICATIONS

H. W. Lau et al., "High Aspect Ratio Submicron Silicon Pillars Fabricated by Photoassisted Electrochemical Etching and Oxidation," App. Phys. Lett., vol. 67, No. 13, p. 1877–1879, 1995.

J. H. Joo et al., "Low Temperature MOCVD BST for High Density DRAM Capacitors," 11$^{th}$ International Symposium on Integrated Ferroelectrics, Abstracts 9C, 1999.

J. Lian et al., "BSTO Thin Films for a DRAM Capacitor–Materials Requirements and Issues," 11$^{th}$ International Symposium on Integrated Ferroelectrics, Abstracts 221, 1999.

A. I. Kingon et al., "Review of Recent Developments in BST Films for DRAMs," 11$^{th}$ International Symposium on Integrated Ferroelectrics, Abstract 281(a), 1999.

Peter Kersten, "An Additive Approach to Multichip Modules, Using Electroless Metallization Processes," The International Journal of Microcircuits and Electronic Packaging, vol 17, No. 1, p. 73–79, 1994.

U.S. patent application Publication No. US 2002/0036336 A1, published on Mar. 28, 2002.

* cited by examiner

INTEGRATED DECOUPLING CAPACITORS

This application is a divisional application of U.S. patent application Ser. No. 09/852,668, filed on May 11, 2001, the entirety of which is incorporated herein by reference now U.S. Pat. No. 6,552,383.

FIELD OF THE INVENTION

The present invention relates to the field of integrated circuits and, in particular, to a method of fabricating compact decoupling capacitors within integrated circuits.

BACKGROUND OF THE INVENTION

Integrated circuits, particularly those used in computer systems, continuously become more powerful and operate at faster speeds. To supply power to circuit components, metal layers dedicated to power supply distribution are formed in the circuits in order to maintain a low inductive voltage drop. The inductive voltage drop can nevertheless be substantial, causing high frequency noise that is superimposed upon the power supply voltage. For future generations of components with multi-GHz chips, in particular, noise in the power and ground lines increasingly becomes a problem.

Bypass capacitors or decoupling capacitors, which act as a charge reservoir, provide an effective way to suppress the power distribution noise. Additionally, decoupling capacitors provide better electrical performance of the integrated circuit. As a result of these benefits, decoupling capacitors are used in many circuit designs.

Decoupling capacitors have been formed over underlying circuitry and/or device layers. For example, with reference to FIG. 1, circuits 10 have been formed having a substrate 2 and device containing layer 4. Thereafter, a decoupling capacitor is formed by deposing dielectric layers 6, 8, and 11, and conductive layers 7 and 9, wherein combined layers indicated by numeral 13 form a decoupling capacitor. As illustrated in FIG. 2, the capacitor plate(s) can be connected to the underlying components, or a power source, by forming a connective layer 15 which extends between a capacitor plate 9 and an underlying conductive layer 4. Insulating surfaces 17 are provided to prevent electrical shorts between conductive layers 7 and 9.

The existing methods for fabricating decoupling capacitors, however, fall short of increasing industry demands that require new performance criteria from supporting components, such as better location within the integrated circuit and higher performance parameters in high-speed environments. What is needed is a method of fabricating decoupling capacitors that are compact, have high-performance characteristics, and are located strategically within the integrated circuit to decouple transient noise and other undesirable signals.

SUMMARY OF THE INVENTION

The present invention discloses a method of fabricating compact decoupling capacitors that are buried in a substrate, and are located strategically to decouple transient noise and other undesirable signals.

A method of forming decoupling capacitors for reducing undesirable noise in an integrated circuit is disclosed, comprising forming an opening within a substrate, where the opening contains fin-like spacers, depositing a dielectric material over the spacers, depositing an electrode material over the dielectric material, depositing an insulative material over the electrode material, and forming integrated circuit components over the insulative material.

Additional features and advantages of the present invention will be more clearly apparent from the detailed description which is provided in connection with accompanying drawings which illustrate exemplary embodiments of the invention.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

The term "substrate" used in the following description may include any semiconductor-based structure that has a semiconductor surface. The term should be understood to include silicon, silicon-on-insulator (SiO), silicon-on-sapphire (SOS), silicon-on-nothing (SON), doped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a "substrate" in the following description, previous process steps may have been utilized to form regions or junctions in or on the base semiconductor or foundation.

Figure 1:
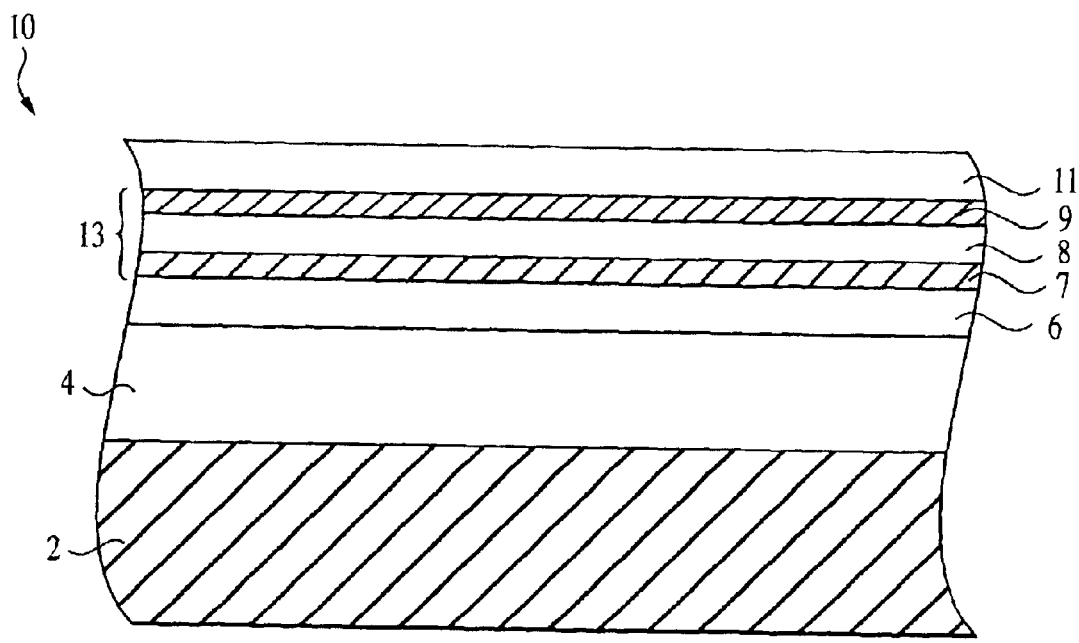
FIG. 1 is a side-sectional view of a prior art integrated circuit containing a decoupling capacitor.
Figure 2:
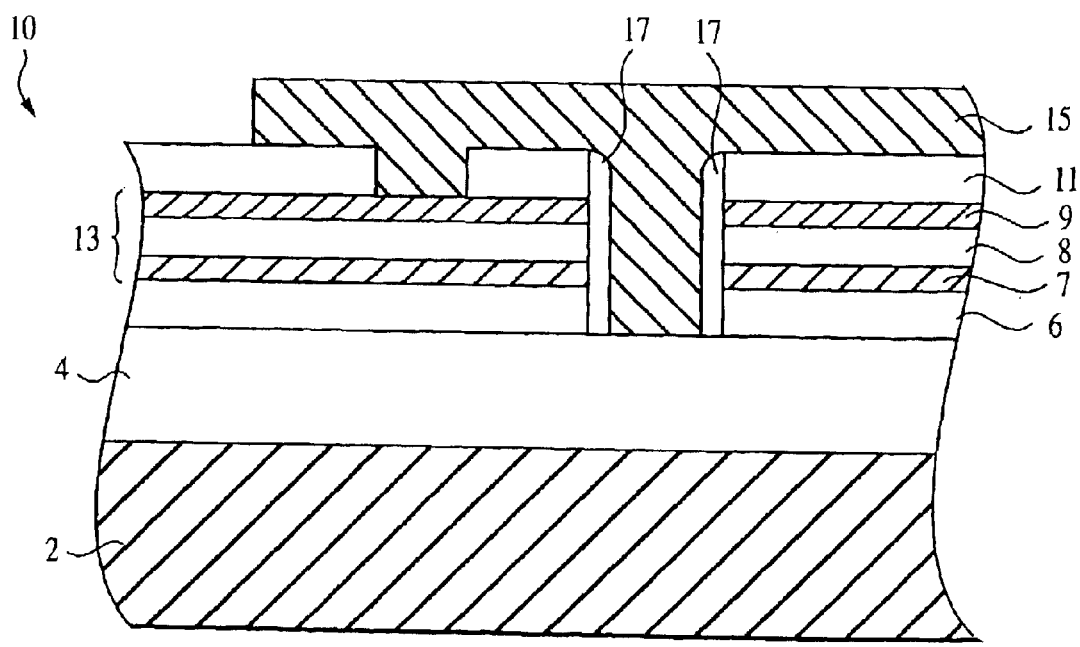
FIG. 2 is a view of the integrated circuit of FIG. 1 at a subsequent stage of fabrication.
Figure 3:
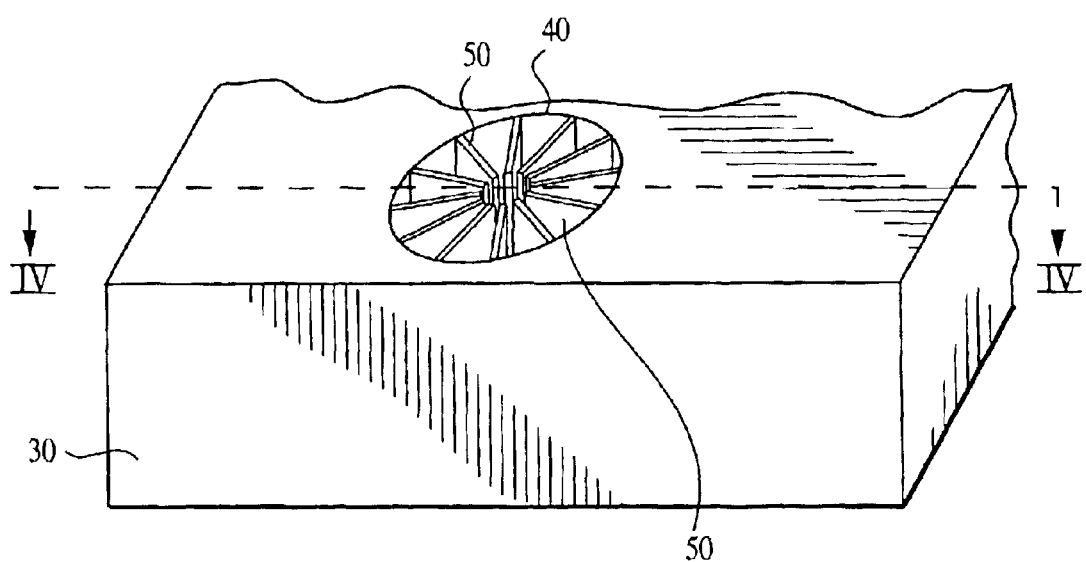
FIG. 3 is a perspective view of a integrated circuit substrate in accordance with an embodiment of the present invention.
Figure 4:
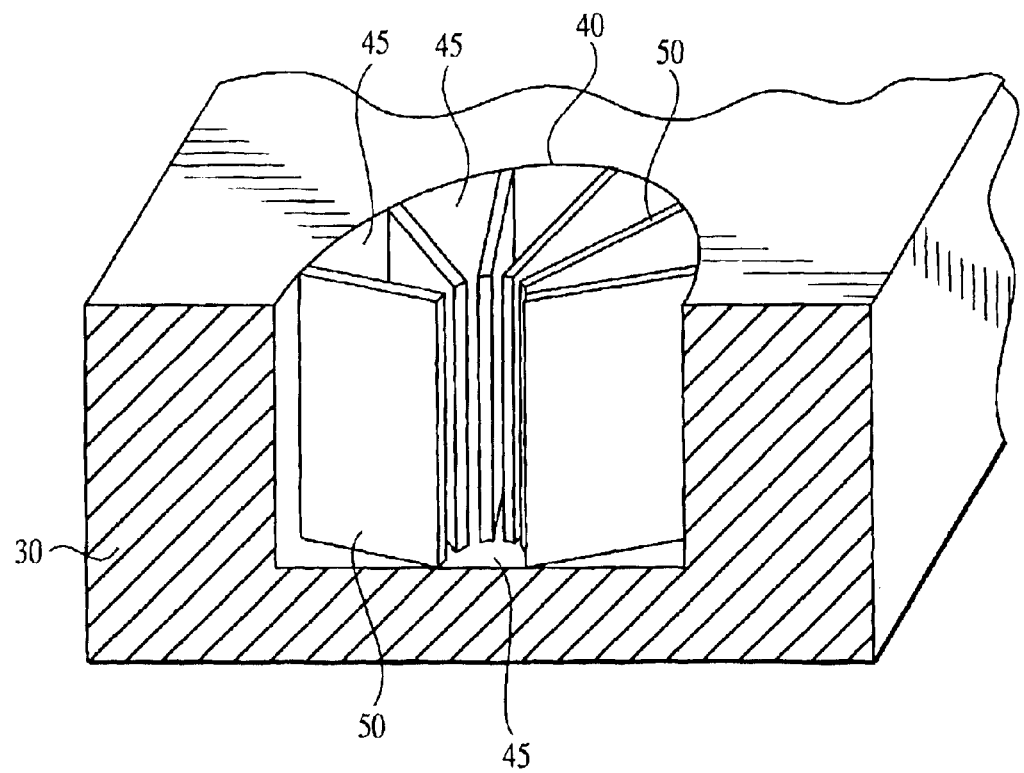
FIG. 4 is a cross-sectional view taken along lines IV—IV of the integrated circuit substrate of FIG. 3.

Referring now to the drawings, where like elements are designated by like reference numerals, FIG. 3 depicts a portion of a substrate 30 which is formed by methods well known in the art. Preferably, the substrate 30 comprises a heavily doped silicon. The substrate 30 can be doped using Alcatel-Mietec's deep n-dope+drive process, or another suitable process. In the substrate 30 a microstructure 40 of silicon fins is fabricated utilizing deep anisotropic plasma etching, such as high etch rate bulk silicon etching. An exemplary deep plasma etching technique that can be utilized in the present invention is that disclosed by Tam Pandhumsoporn, et al., "High etch rate, deep anisotropic plasma etching of silicon for MEMS fabrication," SPIE Vol. 3328, March 1998. As a result of the high etch rate bulk silicon etching, the fan-like structure 40 is formed in the silicon substrate 30. A helpful illustration of the structure 40 is provided in FIG. 4, that depicts a cross-sectional view along line IV—IV of FIG. 3. FIG. 4 illustrates multiple fins or supports 50 formed in a fan-like pattern about a center of the circular opening of structure 40. The structure 40 need not be circular and may, for example, be oval in shape.

The resulting structure 40 is comprised of trenches or open spaces 45 that define a series of fins or supports 50. Each fin 50 is a microstructure that will ultimately become a capacitor, as will be disclosed herein, so the number of fins 50 etched in the structure 40 will depend on multiple integrated circuit design goals and limitations. A structure 40 having a minimum of ten (10) fins 50 is recommended. The fins 50 formed by the above disclosed method have a thickness of approximately 30 microns, however, the thickness can be increased or decreased by the practitioner.

Figure 5A:
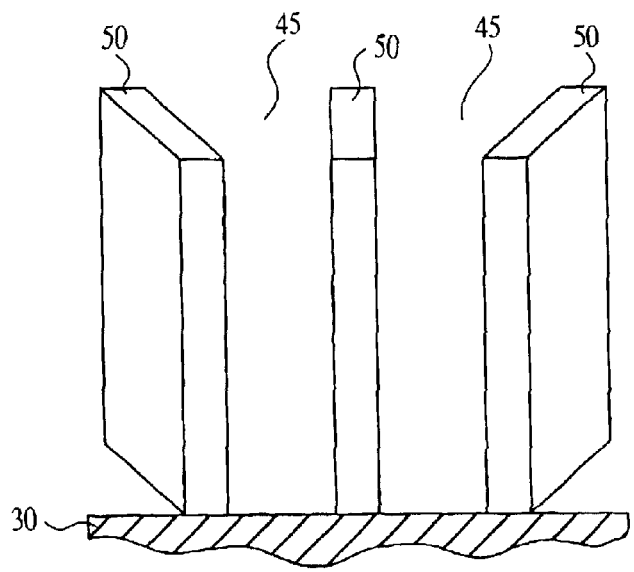
FIG. 5A is an exploded view of the fin-like structures of FIG. 4.
Figure 5B:
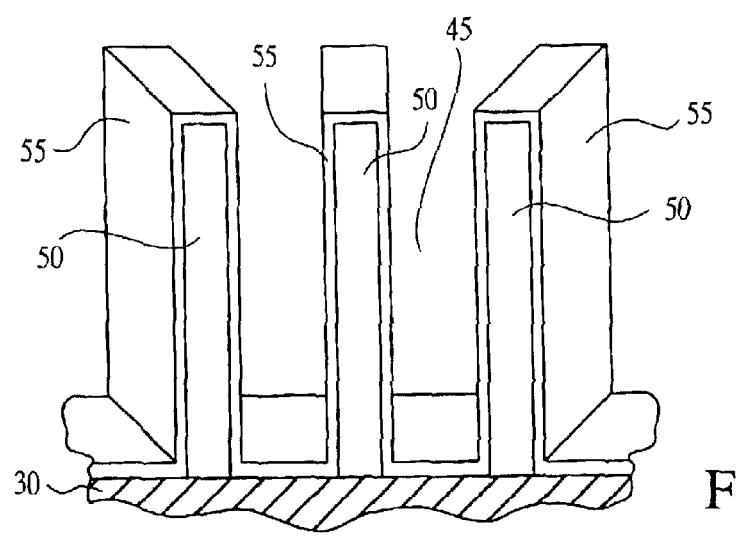
FIG. 5B is a view of the fin-like structures of FIG. 5A at a subsequent stage of fabrication.
Figure 5C:
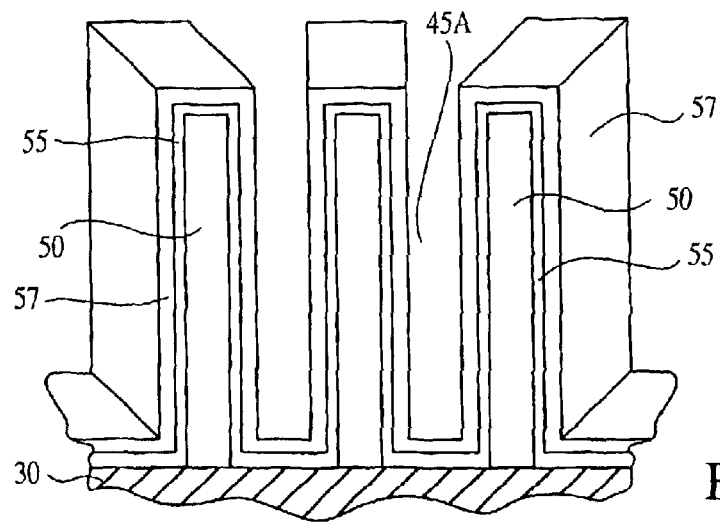
FIG. 5C is a view of the fin-like structures of FIG. 5B at a subsequent stage of fabrication.

With reference to FIGS. 5A–C, formation of the capacitors in accordance with the present invention will be described. FIG. 5A illustrates three of the several fins 50 in the substrate 30 viewed from a perspective similar to that of FIG. 4. Unfilled spaces 45 are between, and define the fins 50. The fins 50 comprise the bottom electrode, or cell plate, of the resulting capacitor. Next, with reference to FIG. 5B, a layer of dielectric material 55 is deposited over the fins 50 and substrate 30 utilizing a process such as Chemical Vapor Deposition (CVD) for conformal coating of the underlying layers. Another exemplary technique for depositing layer 55 is by low temperature Metal Organic Chemical Vapor Deposition (MOCVD) utilizing $(BaSr)TiO_3$ films. The MOCVD deposition of BST or BSTO films as a dielectric provides for additional benefits such as conformal coverage of underlying layers and prevention of oxidation. Because the present invention endeavors to form capacitors having high capacitance, it is preferable that the dielectric material have a high dielectric constant, such as 50 or greater, and a thickness of less than 1000 Angstroms. However, the dielectric layer 55 can comprise various materials with a lower dielectric constant and/or having a higher thickness without departing from the scope of the present invention, as comparable changes will affect only the electrical characteristics of the resulting capacitor.

Thereafter, with reference to FIG. 5C, a top electrode layer 57 is deposited over the dielectric layer 55. The top electrode layer 57 is preferably a metallic film of a noble metal such platinum. The top electrode layer 57 may have a thickness of less than one (1) micron, however, other thicknesses and materials may be used. The unfilled spaces 45A between adjacent structures comprising layers 50, 55, and 57 are reduced as compared to unfilled spaces 45 of FIGS. 5A and 5B.

Figure 6:
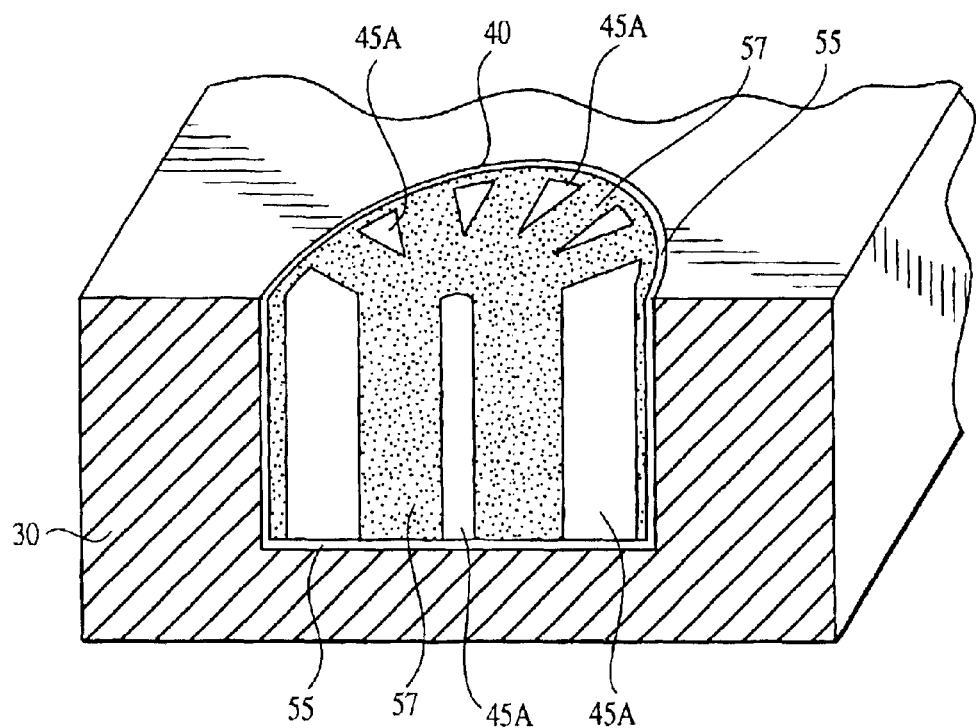
FIG. 6 is a perspective view of the integrated circuit substrate of FIG. 4 at a subsequent stage of fabrication.
Figure 6A:
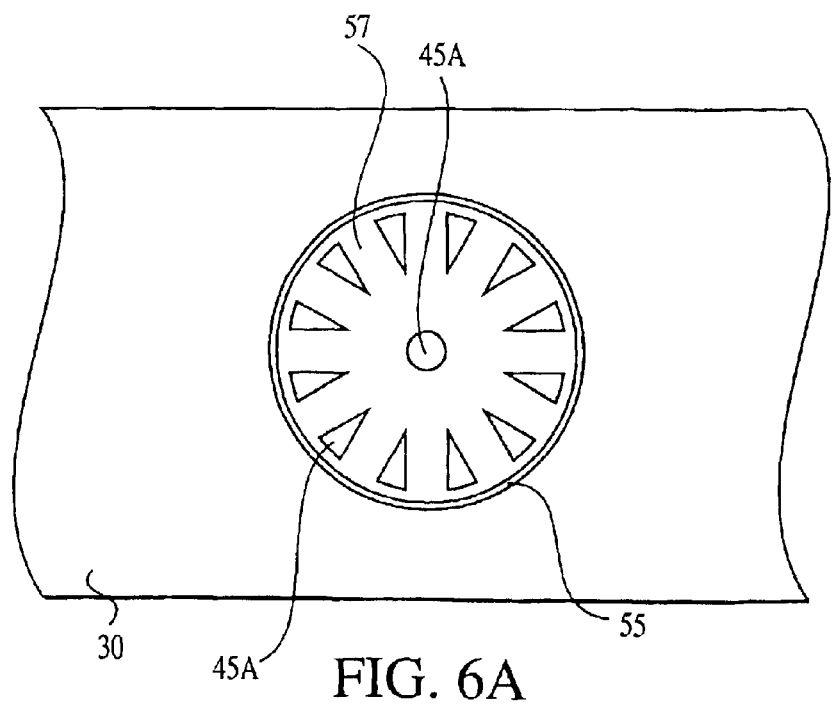
FIG. 6A is a top view of the integrated circuit substrate of FIG. 6.
Figure 7:
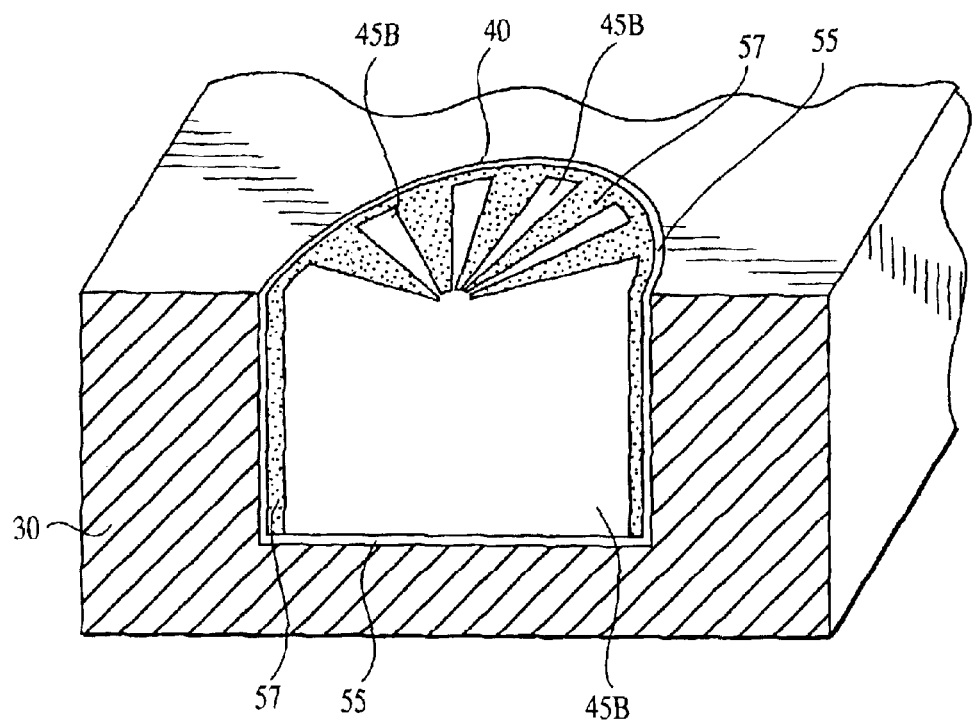
FIG. 7 is a view of the integrated circuit substrate of FIG. 4 at a subsequent stage of fabrication.
Figure 7A:
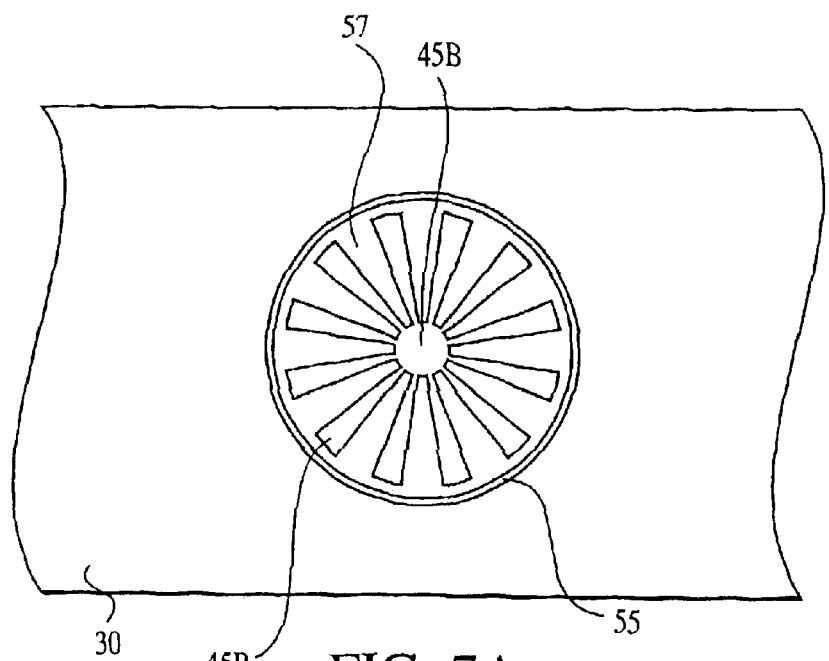
FIG. 7A is a top view of the integrated circuit substrate of FIG. 7.

A perspective view of the resulting structure 40, after deposition of layers 55 and 57, is shown in FIGS. 6 and 6A. The substrate 30 is connected to fins 50, not visible in FIGS. 6 and 6A, and functions as the ground plate of the resulting capacitor(s). The dielectric layer 55 separates both the substrate 30 and the fins 50 from the top electrode layer 57. The unfilled spaces 45A separate each individual structure comprising the fin 50, dielectric 55, and top electrode 57. An alternative resulting structure 40 is illustrated in FIGS. 7 and 7A. Therein, unfilled spaces 45B extend toward the center of the structure 40. The size and shape of the unfilled spaces 45A and 45B will depend, among other factors, on the number of fins 50 etched into the substrate 30, and the thickness of the fins 50 and the layers 55 and 57. The structure 40 is completed by depositing into the unfilled spaces 45A or 45B an insulating material.

Figure 8:
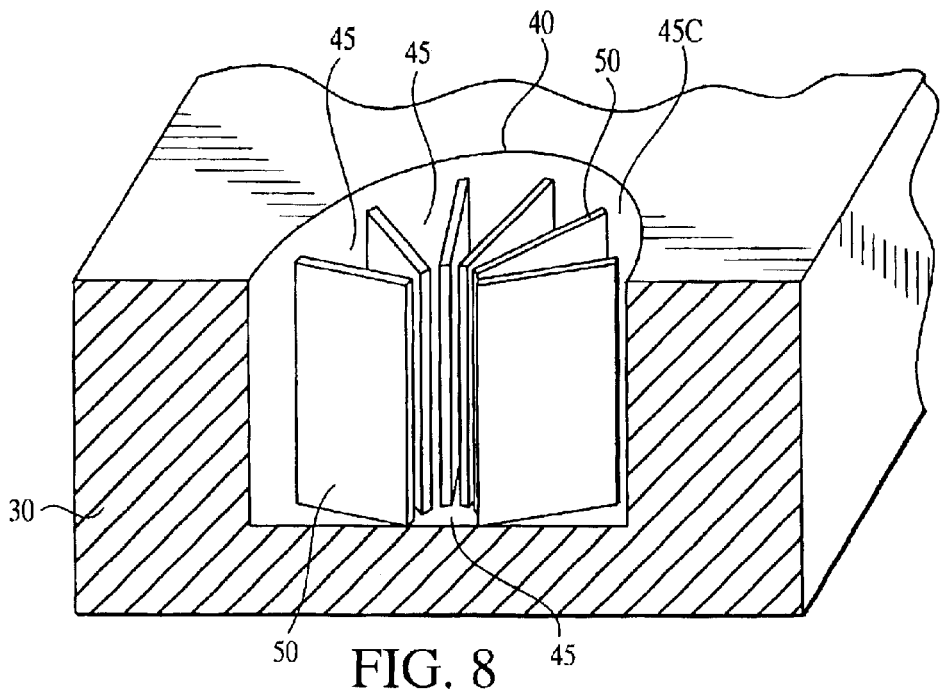
FIG. 8 is a side sectional view of an integrated circuit substrate in accordance with another embodiment of the present invention.
Figure 9:
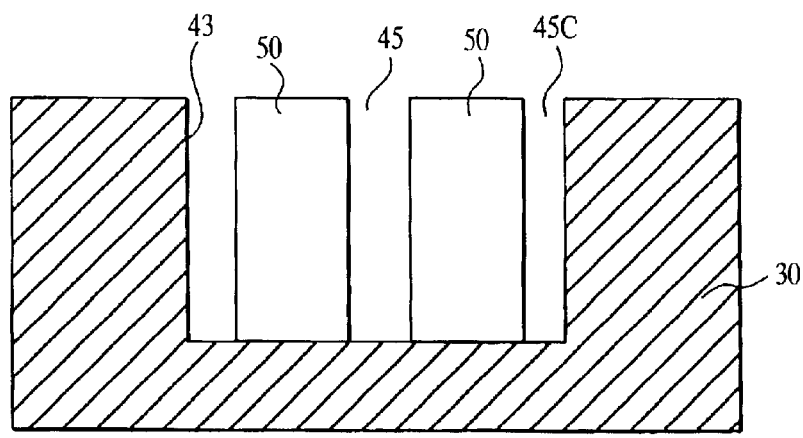
FIG. 9 is a side view of the integrated circuit substrate of FIG. 8.
Figure 10:
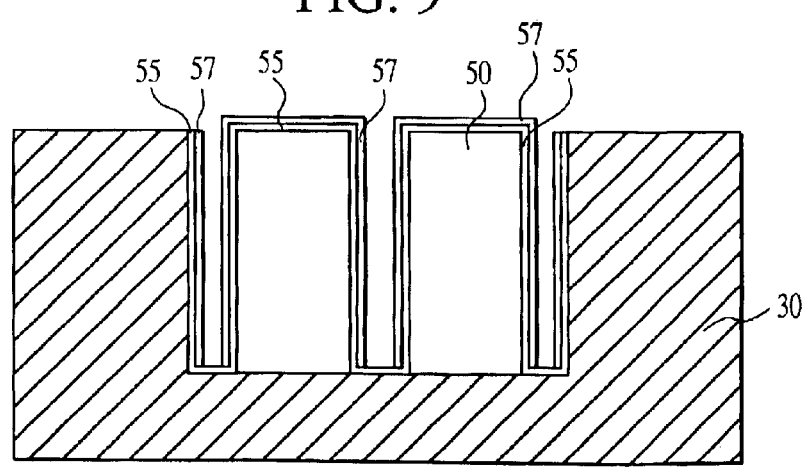
FIG. 10 is a view of the integrated circuit substrate if FIG. 8 at a subsequent stage of application.

In another embodiment of the present invention, illustrated in FIGS. 8 and 9, the fins 50 are etched, in accordance with techniques described above, to be separated from the interior wall 43 of structure 40. This structure, in addition to openings 45 between individual fins 50, has an opening 45C between the fins 50 and the interior wall 43 of substrate 30. Thereafter, utilizing techniques described above, dielectric layer 55 and top electrode layer 57 are deposited over the fins 50, as shown in FIG. 10. The resulting structure 40 of this embodiment allows for each fin 50, with layers 55 and 57, to function as an individual capacitor.

Figure 11:
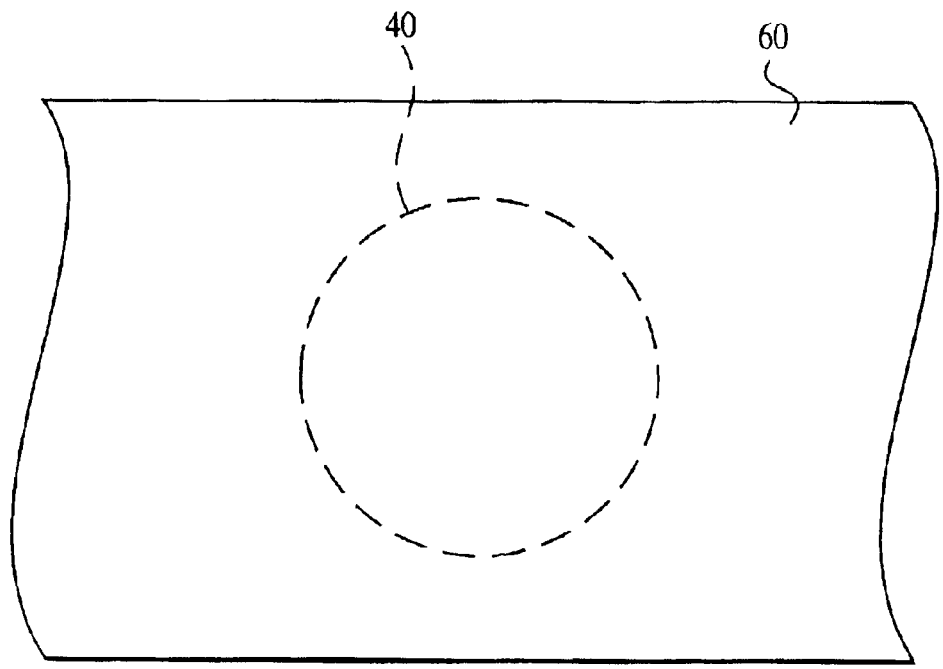
FIG. 11 is a top view of the integrated circuit substrate of FIGS. 6 and/or 7 at a subsequent stage of fabrication.
Figure 12:
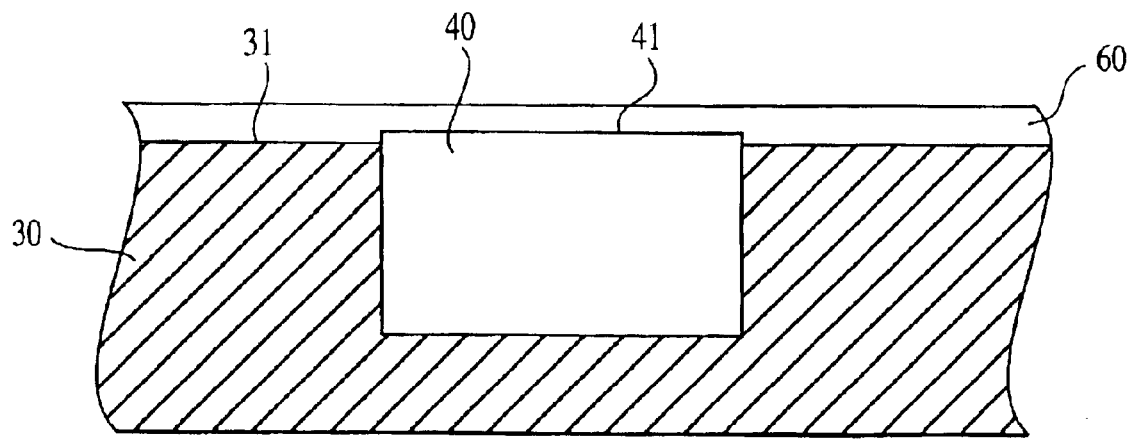
FIG. 12 is a side sectional view of the integrated circuit substrate of FIG. 11.

Next, with reference to FIGS. 11 and 12, the top of the structure 40 and substrate 30 is sealed with an insulative layer 60. An exemplary material for layer 60 is photodefinable polyimide, such as PT 412 manufactured by Ciba-Geigy Corporation, that is spin-coated onto the surfaces. Alternatively, the insulative layer 60 material can be another insulator. The deposition of the insulative layer, and the deposition of an insulative material into spaces 45A, 45B, and 45C as described above, can be accomplished in one process step. Alternatively, the insulative layer 60 can be deposited to cover only the structure 40.

The top surface 41 of structure 40 in FIG. 12, and in subsequent Figures showing a similar side-sectional view, is shown as extending above the top surface 31 of substrate 30. This represents the added thickness of layers 55 and 57, deposited over the fins 50, if the top surfaces of the fins 50 and substrate 30 are elevationally similar, as shown in FIG. 4. The top surface 41 of the structure 40 can be made elevationally similar to or lower than the top surface 31 of substrate 30 by etching the top surfaces of fins 50 to be lower than the top surface 31 of substrate 30 during process steps previously described.

Figure 13:
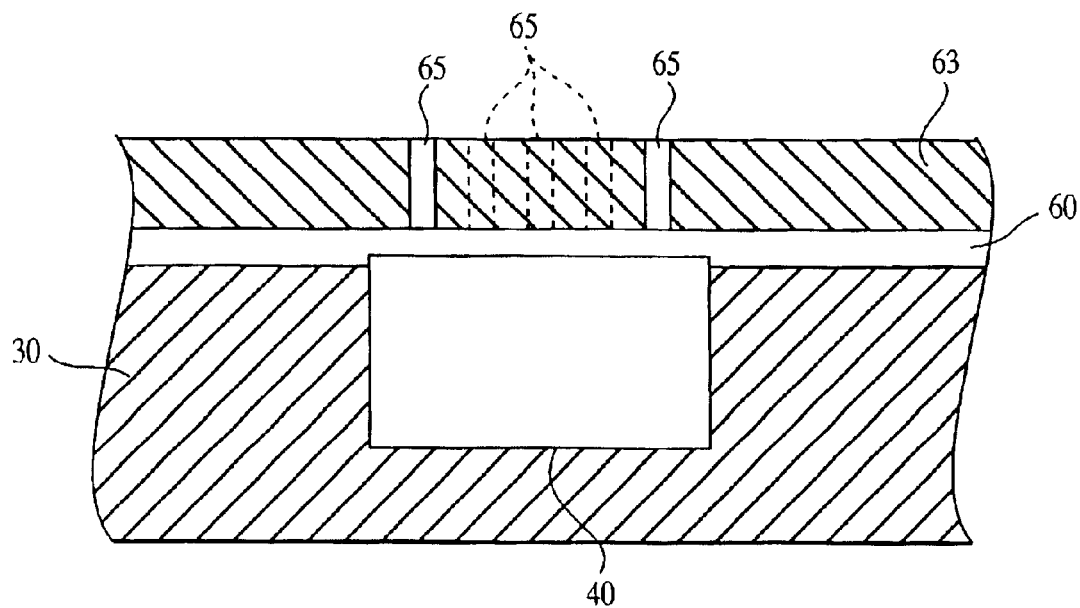
FIG. 13 is a side sectional view of the integrated circuit substrate of FIG. 12 at a subsequent stage of fabrication.
Figure 14:
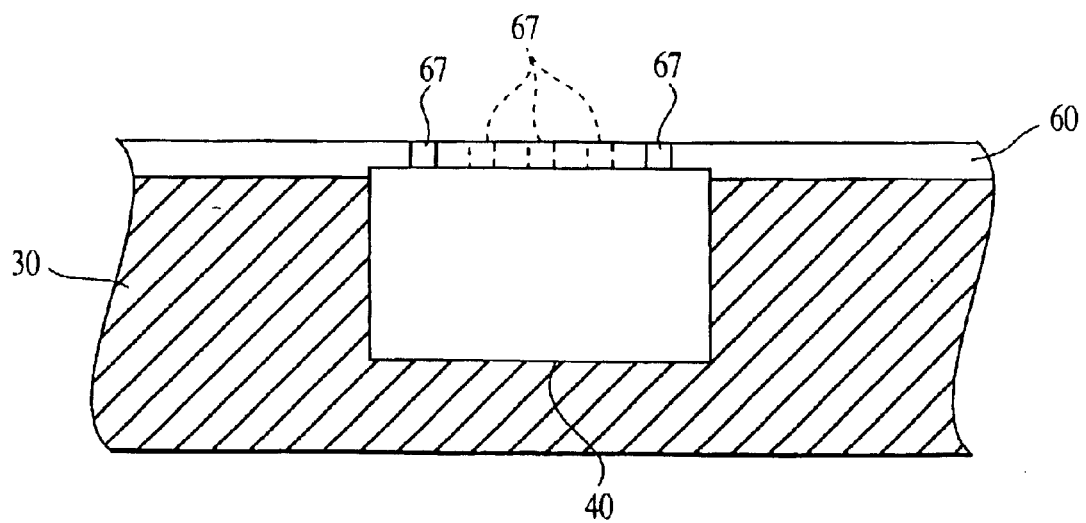
FIG. 14 is a side sectional view of the integrated circuit substrate of FIG. 13 at a subsequent stage of fabrication.
Figure 15:
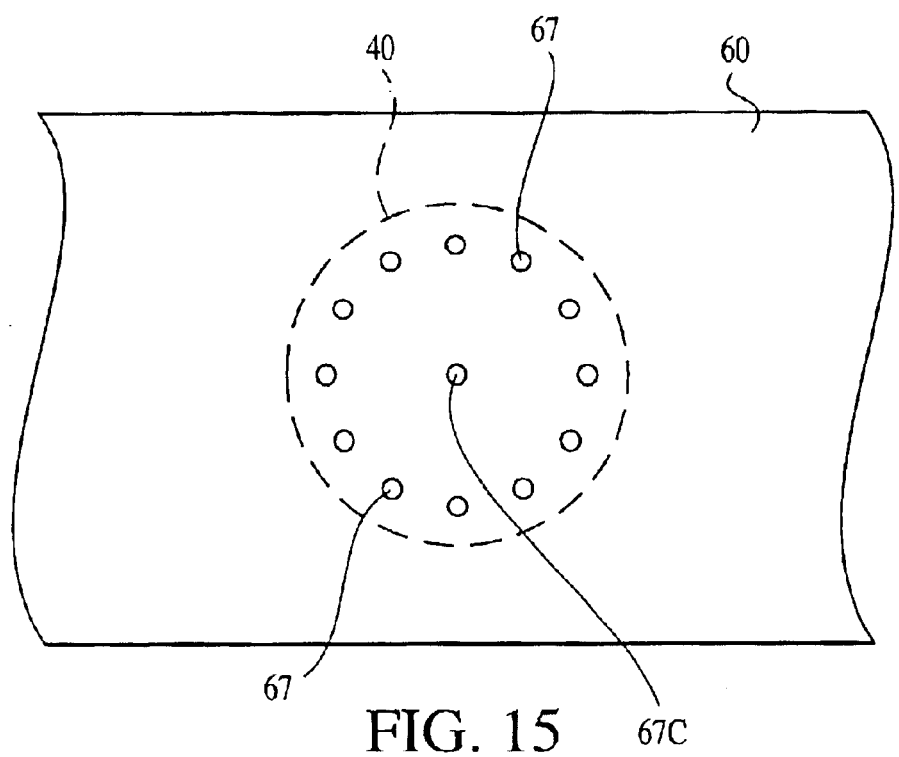
FIG. 15 is a top view of the integrated circuit substrate of FIG. 14.

To form electrical contact opening(s) in the structure 40, a layer of photoresist 63 is formed over the insulating layer 60 to define openings 65, as shown in FIG. 13. Thereafter, openings 67 are etched through the insulative layer 60 down to the top electrode layer 57, and the photoresist layer 63 is subsequently removed, as shown in FIG. 14. An illustrative top view of the openings 67 is shown in FIG. 15. The opening 67C would be formed if the center of the structure 40 is filled with the top electrode layer 57 in the process steps mentioned above. The quantity and locations of openings 67 to the top electrode layer 57 will be chosen by the practitioner according to the number and/or placement of electrical connections desired in the resulting integrated circuit. If the structure 40 is formed in accordance with the embodiment shown in FIGS. 8, 9, and 10, openings 67 would be created over each individual capacitor structure.

Figure 16:
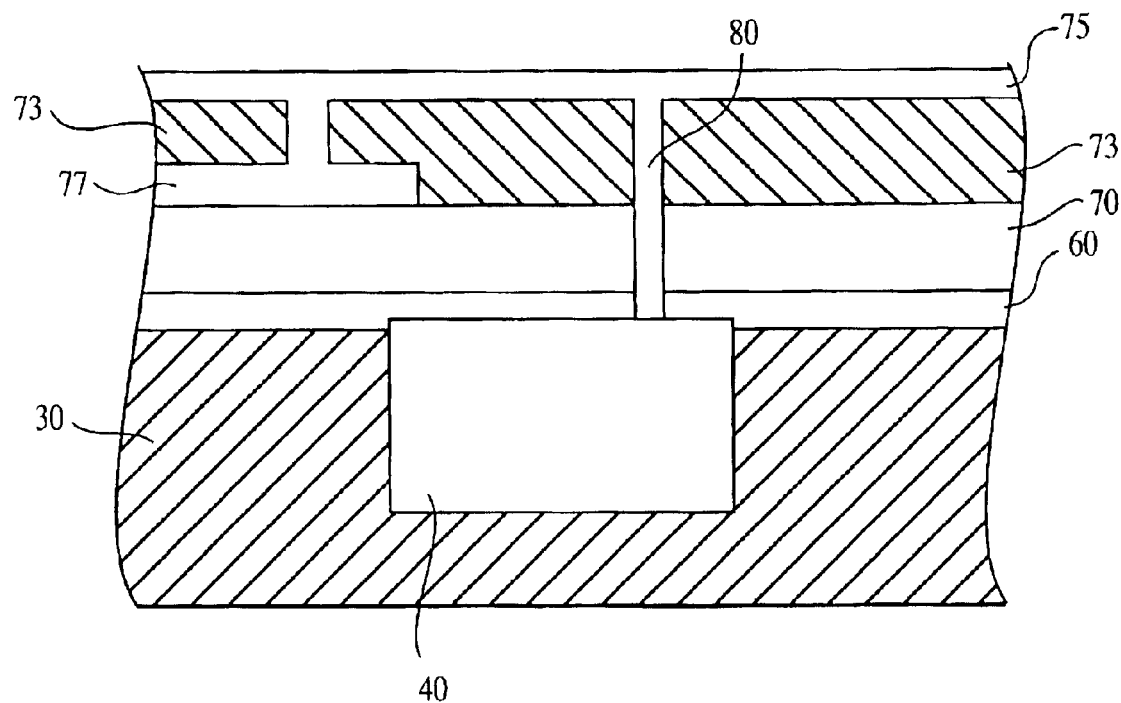
FIG. 16 is a side sectional view of the integrated circuit substrate of FIG. 14 at a subsequent stage of fabrication.

An example of a circuit made possible by the present invention is shown in FIG. 16, wherein an electrical via 80 connects the capacitor structure 40 with a voltage line, or a power supply interconnecting layer 75. The layer 75 may, in turn, supply electrical power to a power layer 77 and various other components. In FIG. 16, layers 70 and 73 can be insulating layers, or layers containing different integrated circuit components, and the via 80 is electrically isolated from those layers.

Figure 17:
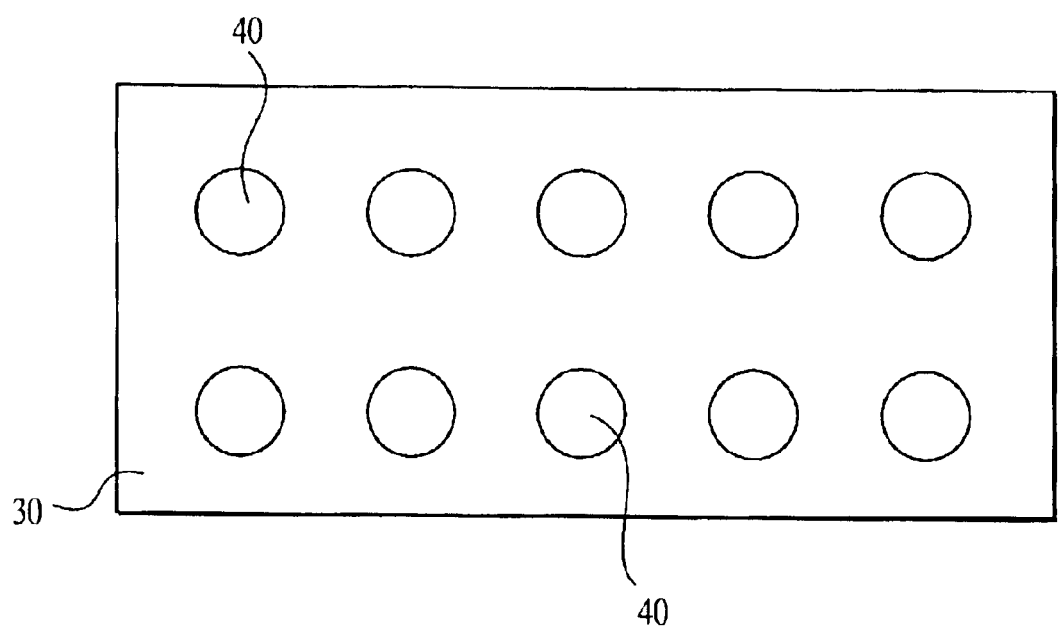
FIG. 17 is a top view of an integrated circuit substrate in accordance with an embodiment of the present invention.

The number of capacitor structures 40 can be chosen by the practitioner to accommodate the desired integrated circuit, as illustrated in FIG. 17 that shows a substrate 30 with multiple capacitor structures 40.

Figure 18:
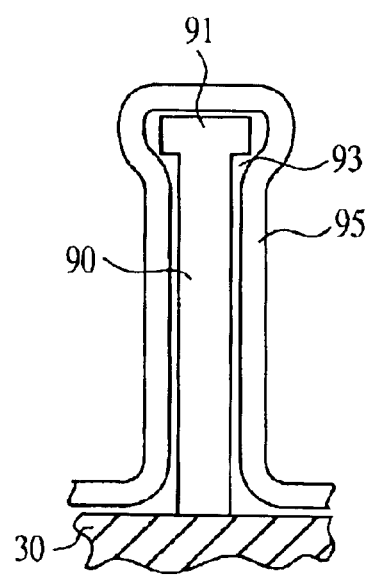
FIG. 18 is a side sectional view of a fin-like structure and covering material layers in accordance with another embodiment of the present invention.

In another embodiment of the present invention, illustrated in FIG. 18, the fins of structure 40 may be formed to have a larger surface on the top 91 of the fin 90, resembling a "T" shape. Such structures may be achieved by undercutting and profiling utilizing the high etch rate bulk silicon etching process discussed above. These fins 90 offer the benefit of providing a greater surface area for the resulting capacitor structure, thus enabling a higher resulting capacitance than fins 50 that are uniform in thickness. The fin 90 would then be covered with a dielectric layer 93 and a top electrode layer 95 to complete the capacitor structure. Alternatively, the fins 90 can be undercut and profiled to have a variable thickness, increasing from bottom to top or vice versa.

Figure 19:
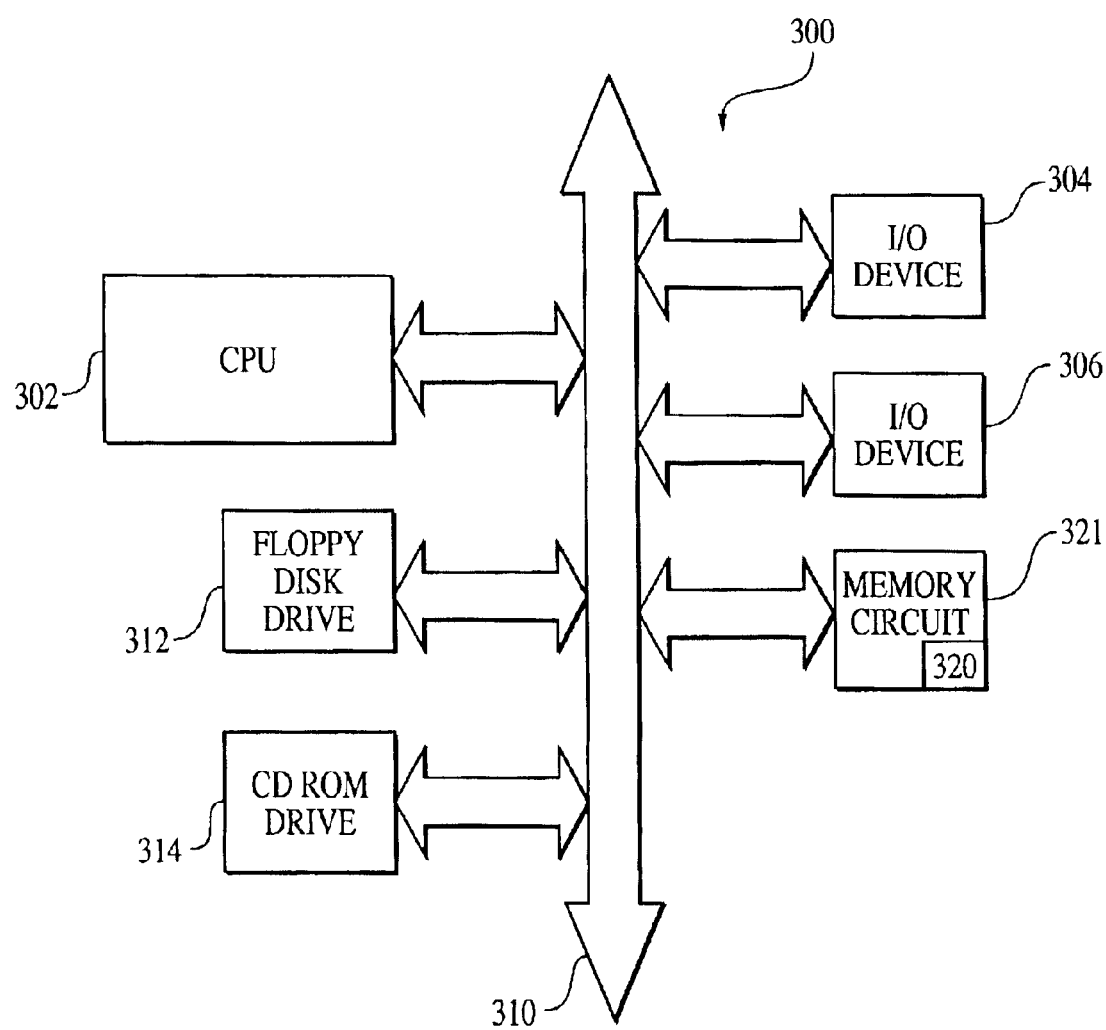
FIG. 19 is a diagram of a computer system according to an embodiment of the present invention.

FIG. 19 illustrates a computer system 300 that may incorporate the benefits of the present invention. The system 300 has a memory circuit 321 coupled through bus 310 to a central processing unit (CPU) 302 for performing computer functions, such as executing software to perform desired tasks and calculations. One or more of the memory circuits 321 and CPU 302 may capacitors constructed in accordance with the present invention. One or more input/output devices 304, 306, such as a keypad or a mouse, are coupled to the CPU 302 and allow an operator to manually input data thereto or to display or otherwise output data generated by the CPU 302. One or more peripheral devices such as a floppy disk drive 312 or a CD ROM drive 314 may also be coupled to the CPU 302. The computer system 300 also includes a bus 310 that couples the input/output devices 312, 314 and the memory circuit 321 to the CPU 302.

While exemplary embodiments of the invention have been described and illustrated, it should be apparent that many modifications can be made to the present inventions without departing from their spirit and scope. Accordingly, the invention is not limited by the foregoing description or drawings, but is only limited by the scope of the appended claims.

What is claimed as new and desired to be protected by Letters Patent of the United States is:

1. A method of forming a capacitor structure comprising:
    forming an opening in a doped semiconductor substrate which contains fin-like spacers extending from a bottom surface of said opening and formed of a doped semiconductor material;
    forming a dielectric material layer over the spacers; and
    forming an electrode material layer over the dielectric material.

2. The method according to claim 1 wherein said opening is formed to be a circular opening.

3. The method according to claim 2 wherein said fin-like spacers are formed in a fan-like pattern about a center of said circular opening.

4. The method according to claim 1 further comprising forming an insulating material layer over said electrode material.

5. The method according to claim 4 further comprising forming contact openings in said insulating material.

6. The method according to claim 5 wherein said contact openings are formed over at least one of said fin-like spacers.

7. The method according to claim 5 wherein said contact openings are formed over a center of said opening in said substrate.

8. The method according to claim 4 further comprising forming integrated circuit components over said insulating layer.

9. The method according to claim 5 further comprising forming a conductive via through said contact openings, and connecting said conductive via to a voltage line.

10. The method according to claim 1 wherein said fin-like spacers and bottom of the opening form a lower plate of said capacitor.

11. The method according to claim 10 wherein said lower plate forms a ground plate of said capacitor.

12. The method according to claim 1 wherein each said dielectric and electrode material layers are formed over said fin-like spacers to provide a plurality of capacitors.

13. The method according to claim 1 wherein said dielectric and electrode material layers are formed over said fin-like spacers to provide a single capacitor.

14. The method according to claim 4 wherein said insulative material layer comprises a photo-definable polyimide layer.

15. The method according to claim 1 wherein said dielectric material layer comprises a BST layer.

16. The method according to claim 1 wherein said dielectric material layer comprises a BSTO layer.

17. The method according to claim 1 wherein said dielectric material layer is formed by MOCVD.

18. The method according to claim 1 wherein said dielectric material layer is formed by CVD.

19. The method according to claim 1 wherein said electrode material layer comprises a noble metal layer.

20. The method according to claim 1 wherein said fin-like spacers are formed to have a constant thickness in cross-section.

21. The method according to claim 1 wherein said fin-like spacers are formed to have a "T" shaped cross-section.

22. The method according to claim 1 wherein said fin-like spacers are formed to have one of an increasing and decreasing cross-section.

23. The method according to claim 1 wherein said dielectric material layer comprises a material having a dielectric constant of at least 50.

24. A method of forming a capacitor in an integrated circuit comprising:
  forming an opening in a doped semiconductor substrate which contains supports of a doped semiconductor material;
  forming a dielectric material layer over said supports;
  forming an electrode material layer over said dielectric material;
  said capacitor being a decoupling capacitor within said integrated circuit.

25. The method according to claim 24 wherein said opening is formed to be a circular opening.

26. The method according to claim 25 wherein said supports are formed in a fan-like pattern about a center of said circular opening.

27. The method according to claim 24 further comprising forming an insulating material layer over said electrode material.

28. The method according to claim 27 further comprising forming contact openings in said insulating material.

29. The method according to claim 28 wherein said contact openings are formed over at least one of supports.

30. The method according to claim 28 wherein said contact openings are formed over a center of said opening in said substrate.

31. The method according to claim 27 further comprising forming integrated circuit components over said insulating layer.

32. The method according to claim 28 further comprising forming a conductive via through said contact openings, and connecting said conductive via to a voltage line.

33. The method according to claim 24 wherein said supports and bottom of the opening form a lower plate of the capacitor.

34. The method according to claim 33 wherein said lower plate forms a ground plate of said capacitor.

35. The method according to claim 27 wherein said insulating material layer comprises a photo-definable polyimide layer.

36. The method according to claim 24 wherein said dielectric material layer comprises a BST layer.

37. The method according to claim 24 wherein said dielectric material layer comprises a BSTO layer.

38. The method according to claim 24 wherein said dielectric material layer is formed by MOCVD.

39. The method according to claim 24 wherein said dielectric material layer is formed by CVD.

40. The method according to claim 24 wherein said electrode material layer comprises a noble metal layer.

41. The method according to claim 24 wherein said supports have a constant thickness in cross-section.

42. The method according to claim 24 wherein said supports have a "T" shaped cross-section.

43. The method according to claim 24 wherein said supports have one of increasing and decreasing cross-section.

44. The method according to claim 24 wherein said dielectric material layer comprises a material having a dielectric constant of at least 50.

45. The method according to claim 24 wherein each said dielectric and electrode material layers are formed over said supports to provide a plurality of capacitors.

46. The method according to claim 24 wherein said dielectric and electrode material layers are formed over said supports to provide a single capacitor.

47. A method of fabricating a capacitor in an integrated circuit comprising:
  forming an opening within a doped semiconductor substrate, said substrate opening containing microstructures formed of a doped semiconductor material;
  forming a dielectric material over said microstructures;
  forming an electrode material over said dielectric material; and
  forming integrated circuit components over said insulative material.

48. The method according to claim 47 wherein said opening is formed to be a circular opening.

49. The method according to claim 48 wherein said microstructures are formed in a fan-like pattern about a center of said circular opening.

50. The method according to claim 47 further comprising forming an insulating material over said electrode material.

51. The method according to claim 50 further comprising forming contact openings in said insulating material.

52. The method according to claim 51 wherein said contact openings are formed over at least one of said microstructures.

53. The method according to claim 51 wherein said contact openings are formed over a center of said opening in said substrate.

54. The method according to claim 51 further comprising forming a conductive via through said contact openings, and connecting said conductive via to voltage line.

55. The method according to claim 47 wherein said capacitor has the function of a decoupling capacitor.

56. The method according to claim 47 wherein said microstructures and bottom of the opening form a lower plate of the capacitor.

57. The method according to claim 56 wherein said lower plate forms a ground plate of said capacitor.

58. The method according to claim 50 wherein said insulating material comprises a photo-definable polyimide material.

59. The method according to claim 47 wherein said dielectric material comprises a BST material.

60. The method according to claim 47 wherein said dielectric material comprises a BSTO material.

61. The method according to claim 47 wherein said dielectric material is formed by MOCVD.

62. The method according to claim 47 wherein said dielectric material is formed by CVD.

63. The method according to claim 47 wherein said electrode material comprises a noble metal material.

64. The method according to claim 47 wherein said microstructures are formed to have a constant thickness in cross-section.

65. The method according to claim 47 wherein said microstructures are formed to have a "T" shaped cross-section.

66. The method according to claim 47 wherein said microstructures are formed to have one of increasing and decreasing cross-section.

67. The method according to claim 47 wherein said dielectric material comprises a material having a dielectric constant of at least 50.

68. The method according to claim 47 wherein each said dielectric and electrode material layers are formed over said microstructures to provide a plurality of capacitors.

69. The method according to claim 47 wherein said dielectric and electrode material layers are formed over said microstructures to provide a single capacitor.

70. A method of forming a structure for reducing noise in an integrated circuit, said method comprising:

providing a doped semiconductor substrate;

forming a capacitor that is recessed within said substrate, wherein said forming said capacitor comprises forming a plurality of doped semiconductor microstructures in an opening in said substrate;

forming semiconductor components over said substrate, said components including a voltage line; and forming an electrical connection between said capacitor and said voltage line.

71. The method according to claim 70 wherein said capacitor functions as a decoupling capacitor.

72. The method according to claim 70 wherein said opening is formed to be a circular opening.

73. The method according to claim 70 wherein said microstructures are formed in a fan-like pattern about a center of said opening.

74. The method according to claim 70 wherein said microstructures and bottom of said opening form a lower plate of said capacitor.

75. The method according to claim 74 wherein said lower plate forms a ground plate of said capacitor.

76. The method according to claim 70 further comprising forming a dielectric material layer over said microstructures.

77. The method according to claim 74 further comprising forming an electrode material layer over said dielectric material layer.

78. The method according to claim 77 further comprising forming an insulating material layer over said electrode material layer.

79. The method according to claim 78 further comprising forming contact openings in said insulating material layer.

80. The method according to claim 79 wherein said contact openings are formed over at least one of said microstructures.

81. The method according to claim 79 wherein said contact openings are formed over a center of said opening in said substrate.

82. The method according to claim 77 wherein each said dielectric and electrode material layers are formed over said microstructures to provide a plurality of capacitors.

83. The method according to claim 77 wherein said dielectric and electrode material layers arc formed over said microstructures to provide a single capacitor.

84. The method according to claim 78 wherein said insulating material layer comprises a photo-definable polyimide layer.

85. The method according to claim 76 wherein said dielectric material layer comprises a BST material layer.

86. The method according to claim 76 wherein said dielectric material layer comprises a BSTO material layer.

87. The method according to claim 76 wherein said dielectric material layer is formed by MOCVD.

88. The method according to claim 76 wherein said dielectric material layer is formed by CVD.

89. The method according to claim 77 wherein said electrode material layer comprises a noble metal layer.

90. The method according to claim 70 wherein said microstructures are formed to have a constant thickness in cross-section.

91. The method according to claim 70 wherein said microstructures are formed to have a "T" shaped cross-section.

92. The method according to claim 70 wherein said microstructures are formed to have one of an increasing and decreasing cross-section.

93. The method according to claim 76 wherein said dielectric material layer comprises a material having a dielectric constant of at least 50.

94. A method of forming a capacitor structure comprising:

forming a plurality of microstructures in a doped silicon substrate, wherein said forming creates a plurality of unfilled spaces adjacent each of said plurality of microstructures;

depositing a layer of dielectric material over said plurality of microstructures and over said unfilled spaces; and forming an electrode layer over said deposited layer of dielectric material.

95. The method of claim 94 wherein said microstructures comprise fin-like structures.

96. The method of claim 95 wherein each of said fin-like structures has a thickness of approximately 30 microns.

97. The method of claim 95 wherein the step of forming a plurality of microstructures comprises forming at least ten fin-like support structures in said substrate.

98. The method of claim 95 wherein said electrode layer is approximately one micron thick.

99. The method of claim 95 wherein the step of forming said plurality of microstructures comprises etching said substrate.

100. The method of claim 95 further comprising etching a top surface of said fin-like structures, such that said top surface of said fin-like structure is lower than a top surface of said substrate.

101. A method of forming a capacitor structure comprising:

forming an opening in a semiconductor substrate, said opening containing fin-like semiconductor spacers extending from a bottom surface of said opening;

doping said semiconductor substrate such that said spacers are doped semiconductor fin-like spacers;

forming a dielectric material layer over the doped spacers; and forming an electrode material layer over the dielectric material.

102. The method according to claim 101 wherein said opening is formed to be a circular opening.

103. The method according to claim 102 wherein said fin-like spacers are formed in a fan-like pattern about a center of said circular opening.

104. The method according to claim 101 further comprising forming an insulating material layer over said electrode material.

105. The method according to claim 104 further comprising forming at least one contact opening in said insulating material.

106. The method according to claim 105 wherein said at least one contact opening is formed over a center of said opening in said substrate.

107. The method according to claim 105 further comprising forming a conductive via through said at least one contact opening, and connecting said conductive via to a conductive line.

108. The method according to claim 104 further comprising forming integrated circuit components over said insulating layer.

\* \* \* \* \*